United States Patent [19]

Takahashi et al.

[11] Patent Number: 5,352,562
[45] Date of Patent: Oct. 4, 1994

[54] IMAGE FORMING PROCESS AND LIGHT-SENSITIVE IMAGE FORMING MATERIAL

[75] Inventors: Yonosuke Takahashi; Hideyuki Nakamura; Fumiaki Shinozaki, all of Shizuoka, Japan

[73] Assignee: Fuji Photo Film Co., Ltd., Kanagawa, Japan

[21] Appl. No.: 858,218

[22] Filed: Mar. 26, 1992

[30] Foreign Application Priority Data

Mar. 26, 1991 [JP] Japan .................. 3-062153
Apr. 26, 1991 [JP] Japan .................. 3-125019
Apr. 26, 1991 [JP] Japan .................. 3-125020

[51] Int. Cl.$^5$ ........................... G03C 3/00
[52] U.S. Cl. ............... 430/253; 430/254; 430/258; 430/259; 430/275; 430/945
[58] Field of Search ........ 430/253, 254, 275, 258, 430/259, 945

[56] References Cited

U.S. PATENT DOCUMENTS 5,041,369  8/1991  Fukui et al. .................. 430/945
5,089,372  2/1992  Kirihata et al. ............... 430/252
5,104,767  4/1992  Nakamura .................... 430/254

FOREIGN PATENT DOCUMENTS 3316038  12/1988  Japan .
2058058   2/1990  Japan .

Primary Examiner—Charles L. Bowers, Jr.
Assistant Examiner—Geraldine Letscher
Attorney, Agent, or Firm—Sughrue, Mion, Zinn, Macpeak & Seas

[57] ABSTRACT

Disclosed is an image forming process employing a light-sensitive image forming material. The image forming material comprises a support, a light-heat conversion layer and an image forming layer, superposed in order. The process comprises the steps of imagewise exposing the image forming material to light so as to increase a bonding strength between the light-heat conversion layer and the image forming layer in the exposed area, pressing a receiving sheet on the light-heat conversion layer, and removing the receiving sheet from the image forming material to form a negative image on the receiving sheet in the unexposed area and to leave a positive image on the light-heat conversion layer in the exposed area. Otherwise, the process comprises the steps of imagewise exposing the image forming material to light so as to decrease a bonding strength between the conversion layer and the image forming layer in the exposed area, pressing a receiving sheet on the conversion layer, and removing the receiving sheet from the image forming material to form a positive image on the receiving sheet in the exposed area and to leave a negative image on the conversion layer in the unexposed area.

15 Claims, 10 Drawing Sheets

IMAGE FORMING PROCESS AND LIGHT-SENSITIVE IMAGE FORMING MATERIAL

FIELD OF THE INVENTION

This invention relates to a process for forming an image by imagewise exposing a light-sensitive image forming material to a high density energy light and an image forming material. The invention particularly relates to a process for formation of an image having a high resolution degree appropriately employable as a masking film (e.g., lith film) or a color proof in the field of printing.

BACKGROUND OF THE INVENTION

There is known a process for forming an image by imagewise exposing a light-sensitive image forming material to a high density energy light. Such process enables formation of a image in daylight needing no dark room, and further the development can be done by dry process using no developing solution.

Japanese Patent Publication (of translated version) No. 2-501552 discloses an example of the above process for formation of an image. The disclosed process utilizes an image-forming element composed of transparent materials through which a light (radiation) for formation of an image passes. The image forming element comprises a support having thereon a fixing layer made of material which liquifies or flows at a predetermined high temperature and a porous layer of granular material, the porous layer having cohesion strength higher than the bonding strength between the porous layer and the fixing layer. Further, at least one layer of the image forming element has a property absorbing the light to convert into heat and a portion of the material of the fixing layer moves, upon receiving the heat, into the adjacent area of the porous layer. Therefore, when the image forming material is cooled, the granular material of the porous layer is wholly fixed to the support to form an image.

Thus, in the image forming process disclosed in the Japanese Patent Publication (of translated version) No. 2-501552, the above image forming element is utilized as a light-sensitive material, and the image is formed on the support by imagewise exposing the image forming element using a high density energy light such as a laser beam. In more detail, the image is formed on the support by allowing the exposed portion of the porous layer of granular material to fix to the support. It is therefore difficult to form a multi-color image using such image forming element.

SUMMARY OF THE INVENTION

An object of the present invention is to provide an image forming process which is developable in daylight using no developing solution.

Another object of the invention is to provide a process for forming a desired multi-color image having a high resolution degree which is appropriately employable as a masking film (e.g., lith film) or a color proof in the field of printing (printing art).

A further object of the invention is to provide a light-sensitive material suitably employable in the image forming process.

There is provided by the present invention an image forming process (A) comprising the steps of:
  imagewise exposing to light a light-sensitive image forming material comprising a support, a light-heat conversion layer provided thereon and an image forming layer provided on the light-heat conversion layer, to increase a bonding strength between the light-heat conversion layer and the image forming layer in the exposed area,
  pressing a receiving sheet onto the image forming layer, and
  removing the receiving sheet from the image forming material together with the image forming layer in the unexposed area so as to form a positive image on the receiving sheet and to leave a negative image on the light-heat conversion layer which corresponds to the image forming layer in the exposed area.

The invention further provides an image forming process (B) comprising the steps of:
  imagewise exposing to light a light-sensitive image forming material comprising a support, a light-heat conversion layer provided thereon, an image forming layer provided on the light-heat conversion layer and a cover sheet provided on the image forming layer, to increase a bonding strength between the light-heat conversion layer and the image forming layer in the exposed area, and
  removing the cover sheet from the image forming material together with the image forming layer in the unexposed area so as to form a positive image on the cover sheet and to leave a negative image on the light-heat conversion layer which corresponds to the image forming layer in the exposed area.

The invention furthermore provides an image forming process (C) comprising the steps of:
  imagewise exposing to light a light-sensitive image forming material comprising a support, a light-heat conversion layer provided thereon and an image forming layer provided on the light-heat conversion layer, to decrease a bonding strength between the light-heat conversion layer and the image forming layer in the exposed area,
  pressing a receiving sheet onto the image forming layer, and
  removing the receiving sheet from the image forming material together with the image forming layer in the exposed area so as to form a negative image on the receiving sheet and to leave a positive image on the light-heat conversion layer which corresponds to the image forming layer in the unexposed area.

The invention furthermore provides an image forming process (D) comprising the steps of:
  imagewise exposing to light a light-sensitive image forming material comprising a support, a light-heat conversion layer provided thereon, an image forming layer provided on the light-heat conversion layer and a cover sheet provided on the image forming layer, to decrease a bonding strength between the light-heat conversion layer and the image forming layer in the exposed area, and
  removing the cover sheet from the image forming material together with the image forming layer in the exposed area so as to form a negative image on the cover sheet and to leave a positive image on the light-heat conversion layer which corresponds to the image forming layer in the unexposed area.

The above-described image forming process can be advantageously performed using a light-sensitive image forming material which comprises a support, a light-heat conversion layer provided thereon comprising a light-absorbing material and a thermoplastic resin, and an image forming layer comprising a coloring material provided on the light-heat conversion layer, and has a property that a bonding strength between the light-heat conversion layer and the image forming layer is increased by being exposed to light.

The image forming process is also advantageously performed using a light-sensitive image forming material which comprises a support, a light-absorbing material layer provided thereon, a thermoplastic resin layer provided on the light-absorbing material layer and an image forming layer comprising a coloring material provided on the thermoplastic resin layer, and has a property that a bonding strength between the thermoplastic resin layer and an image forming layer is decreased by being exposed to light.

The image forming process is also advantageously performed using a light-sensitive image forming material which comprises a support, a light-heat conversion layer provided thereon comprising a metal, metal alloy or metal compound and an image forming layer comprising a coloring material provided on the light-heat conversion layer, and has a property that the metal, metal alloy or metal compound of the light-heat conversion layer is melted to decrease a bonding strength between the image forming layer and the support by being exposed to light. increased by exposing to light;

The image forming process according to the invention enables the formation of an image having a high optical density and a high resolution degree. The process gives an image both on a support and a receiving sheet (or cover sheet). The support having the formed image thereon is favorably employable as a masking film such as lith film and the receiving sheet having the formed image thereon is favorably employable as a color proof.

Thus, in the above image forming process, a set of two images can be formed by one image forming process, that is, an image formed on the support and an image formed on the receiving sheet. Furthermore, a color proof obtained by the process is much approximate in its optical density and hue to a real print.

The light-sensitive image forming material of the invention can be advantageously employed in the image forming process of the invention. In the light-sensitive image forming material of the invention, the image forming layer has no function to convert light into heat and serves only for the formation of an image. The conversion of light to heat is accomplished by a different layer, i.e., the light-heat conversion layer. Hence, any hue of an image can be formed independent of an employed light source, Further, it is possible to easily form an image having a high optical density and a high resolution degree. Particularly, in the case of using a metal or metal alloy layer as the light-heat conversion layer, the image produced on the support has the optical density of the remaining image forming layer as well as the optical density of the unchanged light-heat conversion (metal) layer, so that the thickness of the light-heat conversion layer can be reduced without reduction of sensitivity.

DETAILED DESCRIPTION OF THE INVENTION

The image forming process according to the present invention basically comprising the steps of imagewise exposing to light a light-sensitive image forming material comprising a support, a light-heat conversion layer and an image-forming layer, superposed in order, and removing a portion of the image forming layer using a receiving sheet or a cover sheet.

The processes of the invention are described in more detail by referring to the attached drawings.

Figure 1:
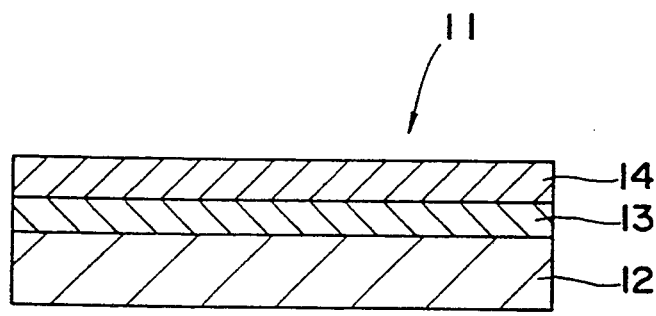
FIG. 1 is a sectional view of a representative example of the light-sensitive image forming material which is advantageously utilized for the image forming process of the invention.
Figure 2:
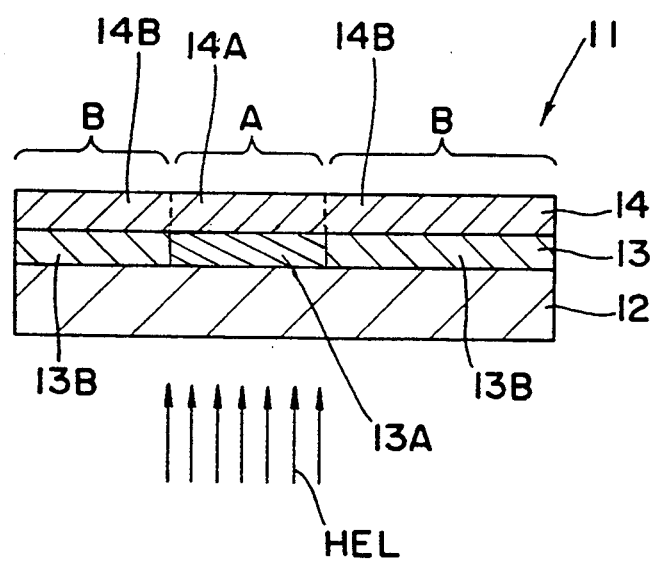
FIG. 2 is a schematic view showing a condition wherein the image forming material of FIG. 1 is imagewise exposed to a high density energy light.
Figure 3:
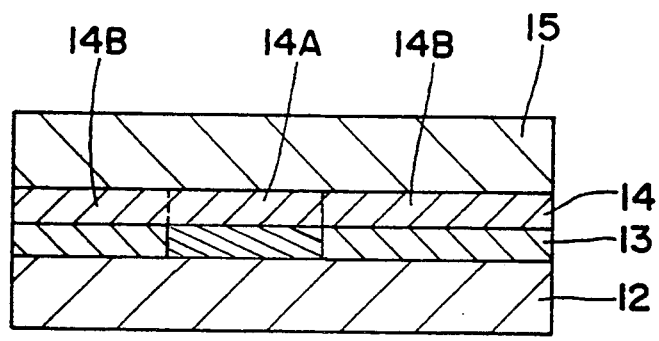
FIG. 3 is a schematic view showing a condition wherein a receiving sheet is laminated on the exposed image forming material of FIG. 2.
Figure 4:
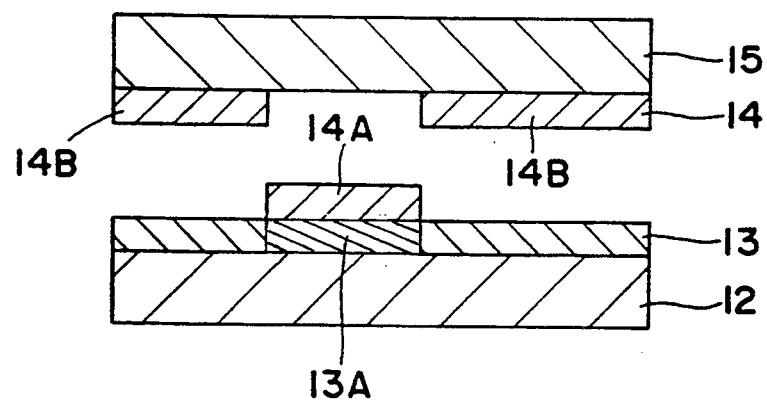
FIG. 4 is a schematic view showing a condition wherein the receiving sheet is removed from the image forming material of FIG. 3.

First, the process (A) of the invention is described by referring to FIGS. 1-3.

The representative structure of the light-sensitive image forming material which is advantageously utilized for the image forming process (A), is shown in FIG. 1.

In FIG. 1, on a support 12 is arranged a light-heat conversion layer 13, and an image forming layer 14 is formed on the light-heat conversion layer 13. The support 12 and the two layers 13, 14 constitute the light-sensitive image forming material 11.

The support 12 serves for supporting various layers (e.g., a light-heat conversion layer, and an image-forming layer) provided thereon. The material of the support preferably has a high mechanical strength, an excellent heat-resistance and a high solvent-resistance. Further, in the case that an exposing of the material to light is conducted using light applied from the support side, the support is required to have a large transmittance at a wavelength of the light source using for the exposure. Accordingly, the support preferably is transparent. Furthermore, in the case of using a laser beam giving a spot of a diameter of a not more than 10 μm, it is preferred that birefringence index of the support is small.

Examples of materials of the support include polyesters such as polyethylene terephthalate (PET), polycarbonates, polystyrenes, cellulose derivatives such as cellulose triacetate, polyolefins such as polypropylene, polyacrylonitrile, polyvinyl chloride, polyvinylidene chloride, polyacrylates such as PMMA (polymethyl methacrylate), polyamides such as nylon, polyimide and polysulfone. Further, a paper sheet, a metal sheet or a glass plate (soda ash glass plate) may be employed. The shape of the support may be in the form of either film, sheet or plate. The thickness of the support is generally in the range of 5 to 300 μm, and preferably in the range of 25 to 200 μm.

The surface of the support may be subjected to various treatments. Examples of the treatments include glow discharge and corona charge treatments which are done for the purpose of increasing bonding strength of the support and the light-heat conversion layer, matting treatment and coating of ultra-violet absorbing layer on the surface opposite to the light-heat conversion layer.

The light-heat conversion layer 13 serves for absorbing a light from a laser beam source or a xenon discharge lamp to convert into heat. As a light source a laser beam source and a xenon discharge lamp are preferred. A laser beam source is particularly preferred. The laser beam source preferably is a semiconductor laser.

The light-heat conversion layer contains a material highly absorbing the applied light. Preferred examples of the material include black pigments such as carbon black, and colored pigments such as phthalocyanine and naphthalocyanine which comprise large ring compounds and absorbs a light of visible to near infrared region. Further, organic dyes capable of absorbing a semiconductor laser beam are preferred. Examples of the organic dyes include cyanine dyes such as an indolenine dye, and organic metal compounds such as dyes of an anthraquinone type, an azulene type, a phthalocyanine type and a dithiol-nickel complex. From the viewpoint of sensitivity, the thickness of the light-heat conversion layer preferably is thin, and therefore a dye employed in the light-heat conversion layer preferably has a large absorption. Therefore, a cyanine dye is preferred.

The light-heat conversion layer preferably contains a binder in addition to the above light-absorbing material. Examples of the binders include cellulose derivatives (e.g., cellulose and cellulose triacetate), acrylic resins (e.g., PMMA (polymethyl methacrylate)), vinyl resins (e.g., polyvinyl chloride, polyvinyl acetate, polyvinyl butyral, polyvinyl formal), polyester resins, polyamide resins, polyolefin resins, polyurethane resins, phenol resins, polystyrene resins, polycarbonate resins, polyacrylonitrile resins, polyvinylidene chloride resins and maleic acid resins. These polymers can be in the form of a homopolymer or a copolymer. Further, silica or inorganic glass can be employed as the binder. Furthermore, the light-heat conversion layer can comprise a product formed by polymerizing a mixture of the light-absorbing material and an acrylate monomer or epoxy resin by irradiation of light or heating.

The ratio of the light-absorbing material to the binder is preferred in the range of 0.1 to 5.0 (light-absorbing material/binder), by weight, particularly preferred in the range of 0.3 to 3.0. The thickness of the light-heat conversion layer generally is in the range of 0.03 to 5 μm, preferably in the range of 0.1 to 2 μm.

The light-heat conversion layer can be formed on the support by a known method. In more detail, the light-absorbing material and the binder are dissolved in an organic solvent to prepare a coating solution. The solution is coated on the support by a coating method such as a rotatable coating method (e.g., whirler coating, spinner coating), a web coating method (e.g., Gravure coating, doctor blade coating, wire bar coating), or a dipping method. In the case of using a pigment as the light-absorbing material, a mixture of the pigment and the binder (and solvent) is preferably dispersed to prepare a coating solution. The dispersing procedure can conducted by a known method using a ball mill, ultrasonic or paint-shaker. Examples of solvents employable for the preparation of the coating solution include conventional solvents such as alcohol, methyl ethyl ketone and methyl cellosolve acetate.

For the purpose of increasing a bonding strength between the light-heat conversion layer and the support, an additive can be incorporated into the coating solution. Preferred examples of the additives include a silane coupling agent and a phenolic compound such as resorcin. The additive content per total amount of the light-absorbing material and the binder preferably is in the range of 2 to 2,000 weight %, more preferably in the range of 5 to 600 weight %. The reason of increasing a bonding strength by the additive is not clearly apparent. However, (1) formation of chemical bond between the additive and the surface of the support, or (2) incorporation of the additive into the surface of the support, is considered as the reason.

The image forming layer 14 contains a coloring material such as a dye or a pigment to render the formed image visible. Bonding strength between the image forming layer and the light-heat conversion layer increases when the image forming material is exposed to light.

The reason of increase of the bonding strength between the image forming layer and the light-heat conversion layer is considered as follows:

(1) the light-heat conversion layer is softened and, fused to the image forming layer, (2) the image forming layer is softened and fused to the light-heat conversion layer, (3) both the image forming layer and the light-heat conversion layer are softened and fused to each other.

It is considered that the mechanism above (1) is most effective as explained later by reference to the attached drawings.

The image forming layer contains a coloring material such as a dye or a pigment, and optionally a binder. Examples of the coloring materials include conventional dyes or pigments such as dyes of an azo type, an anthraquinone type and a phthalocyanine type, and further, if necessary, may include a pigments such as carbon black or titanium dioxide and metal powders such as aluminum.

In the case of using a binder for the preparation of the image forming layer, it is preferred to use the binder having a property which imparts cohesion to the image forming layer and is apt to soften itself. Examples of the binders include cellulose derivatives (e.g., cellulose, and cellulose triacetate), acrylic resins (e.g., PMMA), vinyl resins (e.g., polyvinyl chloride, polyvinyl acetate, polyvinyl butyral, polyvinyl formal), polyester resins, polyamide resins, polyolefin resins, polyurethane resins, phenol resins, polystyrene resins, polycarbonate resins, polyacrylonitrile resins, polyvinylidene chloride resins and maleic acid resins. These polymers can be in the form of homopolymers and copolymers. Further, it is preferred that the binder used in the image forming layer differs from one used in the light-heat conversion layer. The ratio of the binder to the coloring material is preferred in the range of 0.5 to 100 (binder/coloring material), by weight, particularly preferred in the range of 2 to 40. The thickness of the light-heat conversion layer generally is in the range of 0.05 to 5 μm, preferably in the range of 0.1 to 2 μm.

The dispersing method of the pigment, the preparation of the coating solution and the coating method can be conducted in the same manner as the methods described in the formation of the light-heat conversion layer.

The image forming process (A) of the invention is first conducted by imagewise exposing the above heat-sensitive material to light. FIG. 2 shows a condition wherein the light-sensitive material is imagewise exposed to a high density energy light.

In FIG. 2, the light-sensitive material 11 (FIG. 1) is imagewise exposed to a high density energy light (HEL) applied from the side of the support 12. When the support is exposed to the high density energy light, the high density energy light is passed through the support 12 and is incident upon the light-heat conversion layer 13, whereby the light-heat conversion layer 13A in the exposed area is softened. Therefore, the image forming layer 14A is fused to the light-heat conversion layer 13A in the exposed area. On the other hand, the light-heat conversion layer 13B unexposed to the high density energy light (unexposed area) is not softened, so that the bonding strength between the image forming layer 14B and the light-heat conversion layer 13B in the unexposed area remains unchanged.

Subsequently, as shown in FIG. 3, a receiving sheet 15 having an adhesive layer is placed under pressure on the image forming layer 14, to bring the adhesive layer into contact with the exposed image forming layer. The receiving sheet can be previously (before the exposing procedure) provided on the image forming layer in the form of a cover sheet. This structure is used in the image forming process (B) of the invention. Further, the adhesive can be placed on the image forming layer.

Then, the receiving sheet 15 is peeled from the image forming material 11. The bonding strength between the light-heat conversion layer 13 and the image forming layer 14 is less than the bonding strength between the receiving sheet 15 and the image forming layer 14 and the bonding strength between the light-heat conversion layer 13 and the support 12. Further, since the bonding strength between the light-heat conversion layer 13 and the exposed image forming layer 14 increases after the exposing procedure, the bonding strength becomes larger than that between the image forming layer 14 and the receiving sheet 15 in the exposed area. Therefore, the image forming layer 14A in the exposed area is left on the light-heat conversion layer 13A, while the image forming layer 14B in the unexposed area is transferred onto the receiving sheet 15. Thus, the image forming layer is divided into the image forming layer 14B in the unexposed area and the layer 14B in the exposed area.

The receiving sheet 15 has the following functions: (1) function of bonding the image forming layer in the unexposed area to remove the layer from light-heat conversion layer and leaving the image forming layer in the exposed area on the light-heat conversion layer (or the thermoplastic resin layer described later); and (2) function as a permanent support carrying the removed image forming layer (image portion) or (3) function as a temporary support carrying the image portion. It is required that the receiving sheet has a mechanical strength to satisfy the above functions and has an adequate bonding strength to satisfy the (1) above. In more detail, these layers and the sheet are required to satisfy the following conditions.

In the unexposed area;
$F_1 < F_3$
$F_1 < F_2$
In the exposed area;
$F_2 < F_1$
$F_2 < F_3$ wherein "$F_1$" is a bonding strength between the light-heat conversion layer 13 and the image forming layer 14, "$F_2$" is a bonding strength between the image forming layer 14 and the receiving sheet 15, and "$F_3$" is a cohesion strength of the image forming layer 14.

Thus, the receiving sheet 15 generally comprises a support portion having a high mechanical strength and a adhesive layer having an adequate bonding strength provided thereon, whereby both the mechanical strength and the adequate bonding strength are obtained. The support portion of the receiving sheet generally is made of materials described hereinbefore for the support 12. The adhesive layer of the receiving sheet is generally formed by applying to the support a mixture of an agent imparting adhesiveness such as rosin or a plasticizer and an organic polymer. Particularly, materials used in pressure-sensitive adhesive tapes are preferred.

The function (3) above of the receiving sheet is, for example, utilized for the preparation of a color proof in the field of printing. In this case, an image formed on the receiving sheet is laminated on other support (e.g., printing paper) of the proof to be transferred. In such transfer procedure, the bonding between the receiving sheet and the image forming layer is further required to have an adequate releasability to transfer the image to the support of the proof. Preferred materials of the receiving sheet having such function are described in Japanese Patent Publications No. 60(1985)-31238 and No. 60(1985)-40847. The image having a hue of cyan, magenta, yellow or black formed on the receiving sheet is transferred to the printing paper by a laminator.

The thickness of the receiving sheet generally is not less than 5 $\mu m$, preferably not less than 25 $\mu m$. In the case that the thickness is too small, the receiving sheet is lowered in handling performance and dimensional accuracy. Further, it is not preferred that the thickness is too large, and therefore the thickness of the receiving sheet preferably is not larger than 200 $\mu m$ from the viewpoint of handling performance, although the upper limit can not be precisely determined. Since the thickness varies depending upon the desired use, an optimum thickness is adequately determined from the consideration of the use. The cover sheet described later also should have properties required for the above receiving sheet.

Figure 5:
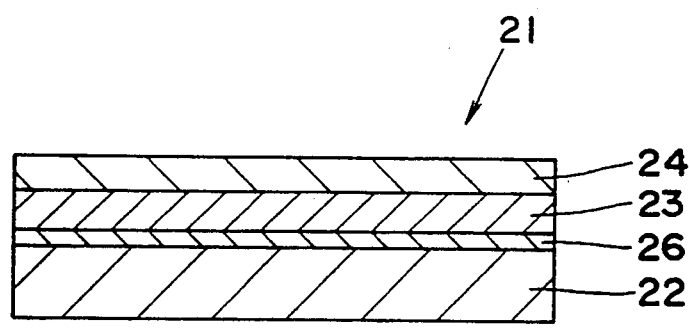
FIG. 5 is a sectional view of another representative example of the light-sensitive image forming material which is advantageously utilized for the image forming process of the invention.

The another representative structure of the light-sensitive image forming material of the invention which is advantageously utilized for the process (A), is shown in FIG. 5.

In FIG. 5, on a support 22 is arranged a subbing layer 26, a light-heat conversion layer 23 is provided thereon, and further an image forming layer 24 is formed on the light-heat conversion layer 23. The support 22 and the three layers 26, 23, 24 constitute the light-sensitive image forming material 21.

The subbing layer 26 is generally provided on the support, for the purpose of increase of the bonding strength between the support and the light-heat conversion layer, and prevention of reduction of sensitivity by way of heat conduction through the support. Hence, the subbing layer should have a large bonding strength to both the support and the light-heat conversion layer, and should have a smaller heat conduction index than the support. The materials of the subbing layers include organic polymers employed in the light-heat conversion layer described previously. Further, additives employed in the light-heat conversion layer such as silane coupling agents can be employed.

The thickness of the subbing layer is generally in the range of 0.01 $\mu m$ to 10 $\mu m$, and preferably in the range of 0.05 $\mu m$ to 3 $\mu m$. A too thin subbing layer renders its coating difficult and its reduction of heat conduction little. A too thick subbing layer renders its drying after coating difficult and reduces its self-leveling property in the coating processor.

The formation of the subbing layer can be conducted by a known coating method.

The another embodiment (A') of the process (A) of the invention is described by referring to FIGS. 6–9.

Figure 6:
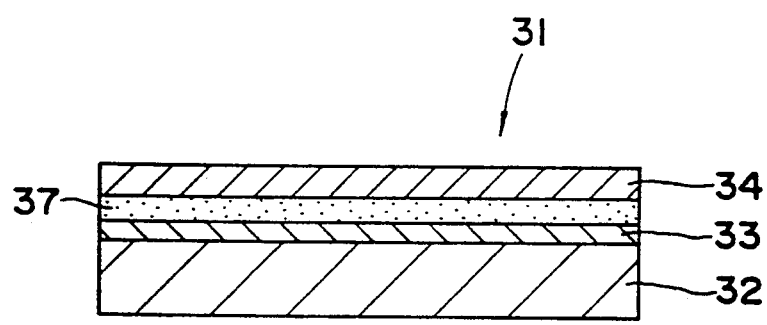
FIG. 6 is a sectional view of a representative example of the light-sensitive image forming material which is advantageously utilized for the image forming process of the invention.

The representative structure of the light-sensitive image forming material which is advantageously utilized for the above process (A'), is shown in FIG. 6.

In FIG. 6, on a support 32 is arranged a light-absorbing material layer 33. A thermoplastic resin layer 37 is formed on the light absorbing material layer 33 and further an image forming layer 34 is formed on the thermoplastic resin layer 37. The support 32 and the three layers 33, 34, 37 constitute the light-sensitive image forming material 31. In the light-sensitive image forming material 31, the light-heat conversion layer is composed of a combination of the light absorbing material layer 33 and thermoplastic resin layer 37.

Figure 7:
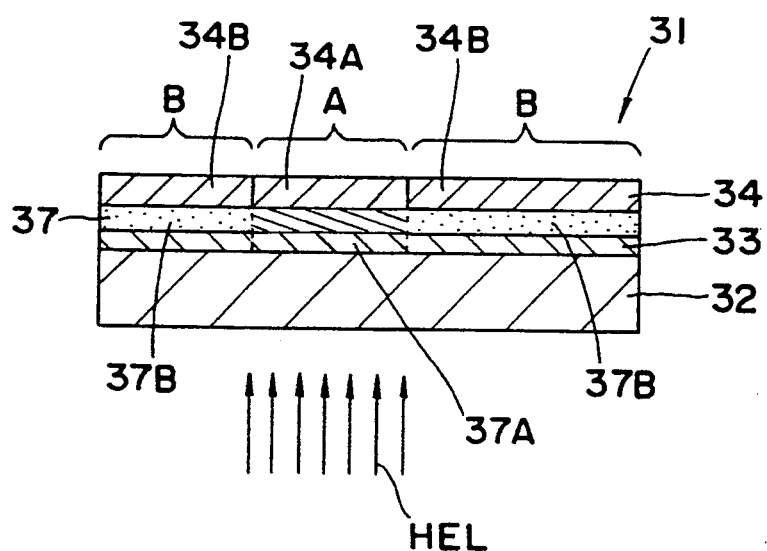
FIG. 7 is a schematic view showing a condition wherein the image forming material of FIG. 6 is imagewise exposed to a high density energy light.

The image forming process (A') is first conducted by imagewise exposing to light the above light-sensitive material. FIG. 7 shows a condition wherein the light-sensitive material is imagewise exposed to a high density energy light.

In FIG. 7, the light-sensitive material 31 of FIG. 6 is imagewise exposed to a high density energy light applied from the side of the support 32. When the support is exposed to the high density energy light, the high density energy light passes through the support 32 and is incident upon the light absorbing material layer 33 and the thermoplastic resin layer 37, whereby the a thermoplastic resin layer 37A in the exposed area is softened. Therefore, the image forming layer 34A is fused to the softened thermoplastic resin layer 37A in the exposed area 37. On the other hand, the a thermoplastic resin layer 37B unexposed to the high density energy light (unexposed area) does not change in its condition, so that the light-heat conversion layer 37B in the unexposed area does not strongly bond the image forming layer 34.

Figure 8:
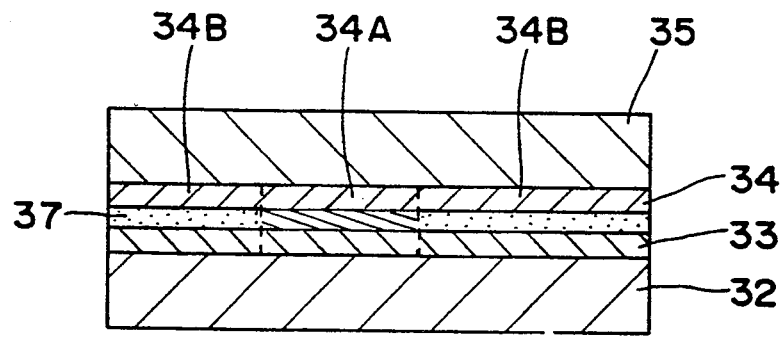
FIG. 8 is a schematic view showing a condition wherein a receiving sheet is laminated on the exposed image forming material of FIG. 8.

Subsequently, as shown in FIG. 8, the receiving sheet 35 having an adhesive layer is placed on the image forming layer 34 under pressure. The receiving sheet 35 may be previously (before the exposing procedure) provided on the image forming layer in the form of a cover sheet. This structure is used in the image forming process (B) of the invention. Further, an adhesive can be coated on the image forming layer.

Figure 9:
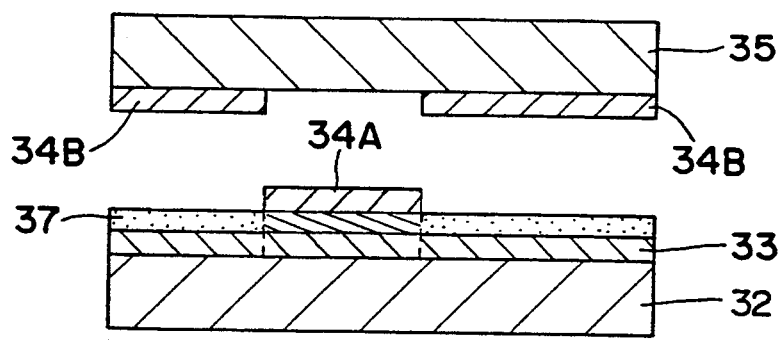
FIG. 9 is a schematic view showing a condition wherein the receiving sheet is removed from the image forming material of FIG. 8.

Then, as shown FIG. 9, the receiving sheet 35 is peeled from the support 32. The bonding strength between the thermoplastic resin layer 37 and the image forming layer 34 is less than that of any interface between other layers. Further, since the bonding strength between the thermoplastic resin layer 37 and the image forming layer 34 increases by the above exposing, the bonding strength becomes larger than that between the image forming layer 34 and the receiving sheet 35. Therefore, the image forming layer 34A in the exposed area is left on the thermoplastic resin layer 37, while the image forming layer 34B in the unexposed area is transferred onto the receiving sheet 35. Thus, the image forming layer is divided to give the image forming layer 34B in the unexposed area and the layer 34A in the exposed area.

The thermoplastic resin layer 37 is generally provided on the light absorbing material layer 33, for the purpose of (1) improvement of balance of the bonding strengths of the interfaces between the layers (e.g., for rendering the bonding strength in the exposing area larger than that in the unexposed area), (2) prevention of swelling of the light absorbing material layer by solvents of a coating solution for the image forming layer (barrier effect), and (3) prevention of transferring of the light absorbing material layer to the receiving sheet (which gives fog).

Figure 10:
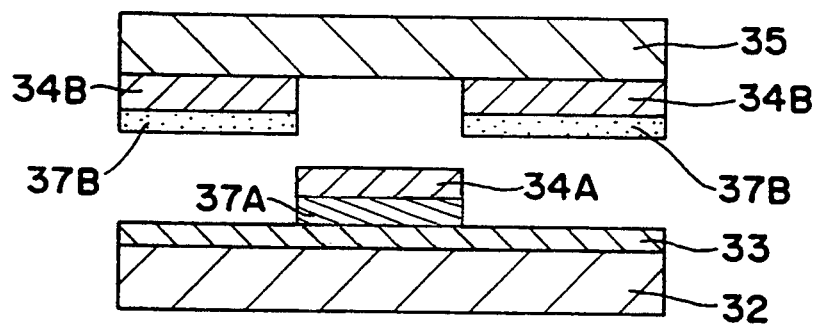
FIG. 10 is a sectional view showing another condition wherein the receiving sheet is removed from the image forming material of FIG. 8.

There are two image recording modes in the process of forming an image using the combination of the thermoplastic resin layer and the light absorbing material layer instead of the light-heat conversion layer. In more detail, one recording mode (a) is the mode wherein removal of the image forming layer in the unexposed area is made on the interface between the thermoplastic resin layer and the image forming layer, the mode being explained by reference to the above FIGS. 6–9; and the other recording mode is the mode wherein removal of the image forming layer in an unexposed area is conducted on the interface between the thermoplastic resin layer and the light absorbing material layer, the mode being shown in FIG. 10. The former has a advantage that little fog occurs, and the latter has advantage that a high sensitivity is easily obtained.

The materials of the thermoplastic resin layer include thermoplastic polymers employed in the light-heat conversion layer described previously. Further, additives employed in the light-heat conversion layer such as silane coupling agents can be employed. The thermoplastic resin layer may have a hue or not. Further, the thermoplastic resin layer may be colored with the same or similar hue as or to that of the image forming layer.

The thickness of the thermoplastic resin layer is generally in the range of 0.01 μm to 5 μm, and preferably in the range of 0.05 μm to 2 μm, in the recording mode (a). A too thick layer gives a large heat capacity, so that the heat-conductivity which conducts heat to the interface between the thermoplastic layer and the image forming layer is lowered. The thickness of the thermoplastic resin layer is generally in the range of 0.01 μm to 10 μm, and preferably in the range of 0.05 μm to 5 μm, in the recording mode (b). A too thick layer renders its resolution small. In both modes, a too thin layer renders control of a uniform coating difficult to cause fluctuation of sensitivity or development.

The formation of the thermoplastic resin layer can be conducted by a known coating method.

Figure 11:
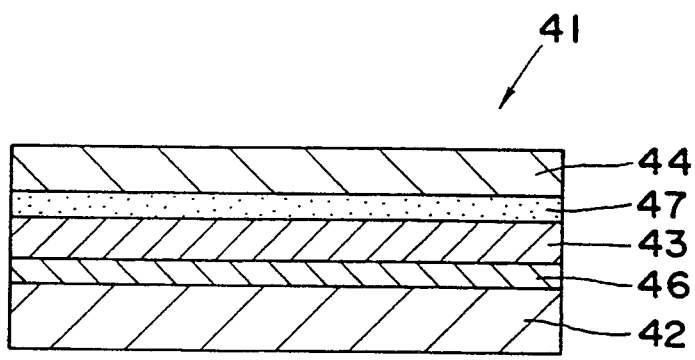
FIG. 11 is a sectional view of another representative example of the light-sensitive image forming material which is advantageously utilized for the image forming process of the invention.

The above light-sensitive image forming material having the thermoplastic resin layer may have the subbing layer (shown in FIG. 5) as shown in FIG. 11.

In FIG. 11, on a support 42 is arranged a subbing layer 46, a light absorbing material layer 43 is provided thereon, a thermoplastic resin layer 47 is provided on the light absorbing material layer 43 and further an image forming layer 44 is formed on the thermoplastic resin layer 47. The support 42 and the four layers 46, 43, 47, 44 constitute the light-sensitive image forming material 41.

The image forming process (B) of the invention is described by referring to FIGS. 1, 2, 4 and 12.

Figure 12:
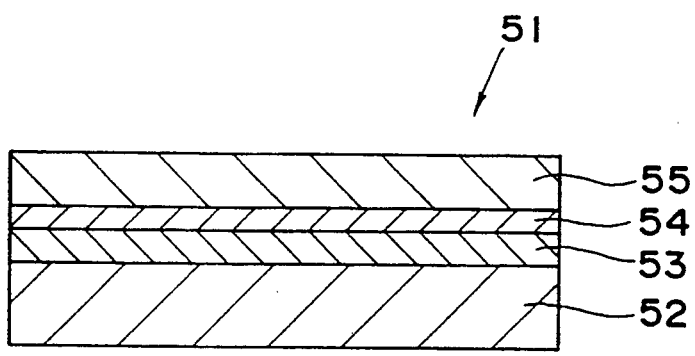
FIG. 12 is a sectional view of a representative example of the light-sensitive image forming material having a cover sheet which is advantageously utilized for the image forming process of the invention.

The representative structure of the light-sensitive image forming material having a cover sheet which is advantageously utilized for the image forming process (B), is shown in FIG. 12.

In FIG. 12, on a support 52 is arranged a light-heat conversion layer 53, an image forming layer 54 is formed on the light-heat conversion layer 53, and further a cover sheet (serving as receiving sheet) 55 is formed. The support 52, the two layers 53, 54 and the sheet 55 constitute the light-sensitive image forming material 51.

The light-sensitive image forming material 51 has a cover sheet, which serves as a receiving sheet in FIG. 1. The image forming process (B) is performed in the same manner as the image forming process (A) except for using the above cover sheet instead of the receiving sheet.

In more detail, the light-sensitive image forming material 51 is imagewise exposed to a high density energy light applied from the side of the support 52 shown in FIG. 2, as a result, the image forming layer 54 is fused to the softened light-heat conversion layer 53, while the light-heat conversion layer 53 in the unexposed area does not strongly bond the image forming layer. Then, the cover sheet 55 is peeled from the image forming material 51, whereby the image forming layer 54 in the exposed area is left on the light-heat conversion layer 53, while the image forming layer 54 in the unexposed area is transferred onto the cover sheet 55.

For the support 52, the light-heat conversion layer 53, the image-forming material layer 54 and the cover sheet (receiving sheet) 56, materials employed in the image forming process (A) can be employed.

Figure 13:
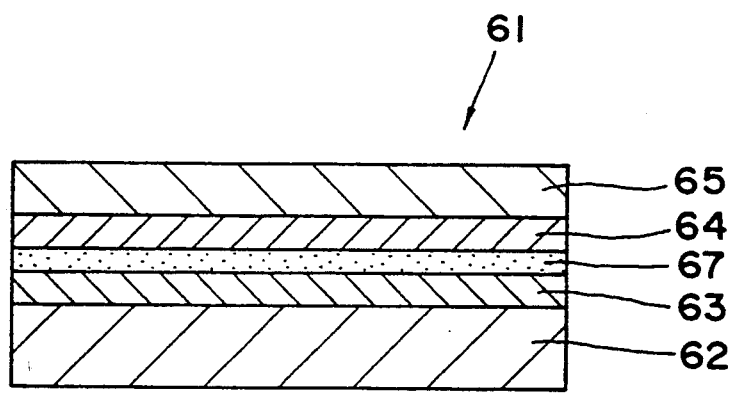
FIG. 13 is a sectional view of another representative example of the light-sensitive image forming material having a cover sheet which is advantageously utilized for the image forming process of the invention.

The another structure of the light-sensitive image forming material having a cover sheet which is advantageously utilized for the image forming process (B), is shown in FIG. 13.

The light-sensitive image forming material is advantageously utilized for the above image forming process (A'), and therefore has the thermoplastic resin layer.

In FIG. 13, on a support 62 is arranged a light absorbing material layer 63, a thermoplastic resin layer 67 is formed on the light absorbing material layer 63, an image forming layer 64 is formed on the thermoplastic resin layer 67 and further a cover sheet 65 is formed on the image forming layer 64. The support 62, the three layers 63, 64, 67, and the sheet 65 constitute the light-sensitive image forming material 61. The image forming process (B) is performed in the same manner as the image forming process (A') except for using the cover sheet in place of the receiving sheet.

Subsequently, the image forming process (C) of the invention is described by referring to FIGS. 14–17.

Figure 14:
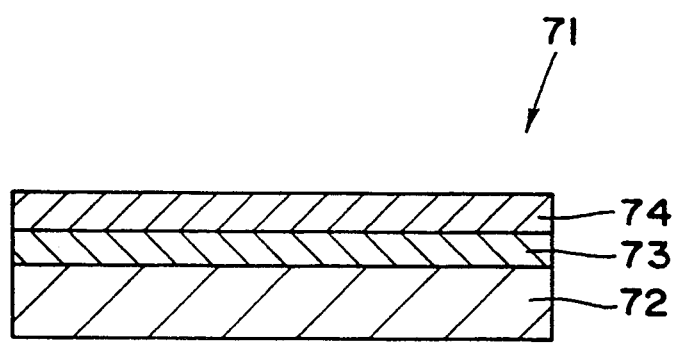
FIG. 14 is a sectional view of a representative example of the light-sensitive image forming material which is advantageously utilized for the image forming process of the invention.

The representative structure of the light-sensitive image forming material which is advantageously utilized for the image forming process (C) is shown in FIG. 14.

In FIG. 14, on a support 72 is arranged a light-heat conversion layer 73, and an image forming layer 74 comprising a metal or metal alloy is formed on the light-heat conversion layer 73. The support 72 and the two layers 73, 74 constitute the light-sensitive image forming material 71.

So long as the support 72 is formed to film or plate, its material is not restricted. Examples of materials of the support include polyesters such as polyethylene terephthalate (PET), polycarbonate, polystyrene, cellulose derivatives such as cellulose triacetate, polyolefins such as polypropylene or polyethylene, polystyrene, polyacrylonitrile, styrene/acrylonitrile copolymer, polyvinyl chloride, polyvinylidene chloride, polyacrylates such as polymethyl methacrylate, polyamides such as nylon, polyimide and polysulfone. Polyethylene terephthalate and polycarbonate are preferred. Further, a paper sheet, a metal sheet and a glass plate (soda ash glass plate) may be employed depending on the desired use. The thickness of the support is generally in the range of 10 to 400 μm, and preferably in the range of 50 to 200 μm.

The light-heat conversion layer 73 contains a light-heat conversion material. The material is not restricted so long as it absorbs a high density energy light to convert into heat. Such properties cause variation of volume of the layer. Examples of the material include metal, metal alloy and metal compound. Preferred examples of the metal and metal alloy include metals and metal alloys having low melting points such as Sn, In, Al, Ga, Ta and Sb. Preferred examples of the metal compound include metal sulfides such as SnS and GeS, metal oxides such as $In_2O_3$, $SnO_2$ and $TeO_2$, and metal halides. The light-heat conversion layer more preferably is a co-deposited layer of In or Sn and SnS or GeS. The light-heat conversion layer 73 containing the above metal (including metal alloy and metal compound) preferably is a thin metal layer formed on the support by depositing the metal by vacuum deposition, sputtering or ion plating method. The thickness of the light-heat conversion layer is generally in the range of 0.01 to 0.5 μm.

On the surface of the light-heat conversion layer (support side or image-forming side), an anti-reflection film comprising a chalcogen compound such as SnS or GeS having a refractive index differing from a metal preferably is provided.

The image forming layer 74 contains a coloring material. Examples of the materials include carbon black, graphite, inorganic pigments (e.g., titanium dioxide, zinc oxide), organic pigments (e.g., pigments of azo type, anthraquinone type, phthalocyanine type), organic dyes (e.g., dyes of azo type, phthalocyanine type, triphenylmethane type, cyanine type). Further, the material may be metal powders such as aluminum powder and nickel powder.

The image forming layer 74 may contain a binder in addition to the coloring material. Examples of the binders include cellulose derivatives (e.g., cellulose acetate butyrate, methyl cellulose, and cellulose triacetate), polystyrene, styrene/maleic acid copolymer, methacrylic acid/benzyl methacrylate copolymer, polyvinylpyrrolidone, gelatin, polyvinyl alcohol, and an esterified resin. styrene/maleic acid copolymer and methacrylic acid/benzyl methacrylate copolymer are preferred. Further, the image forming layer 74 may contain a stabilizing agent such as fade-prevention agent (i.e., light stabilizer).

The ratio of the binder to the coloring material is preferred in the range of 0.5 to 100 (binder/coloring material), by weight, and particularly preferred in the range of 2 to 40. The thickness of the light-heat conversion layer is generally in the range of 0.05 to 10 μm, preferably in the range of 0.2 to 1.0 μm.

The image forming layer 74 can be formed on the light-heat conversion layer 73 by coating a dispersion obtained by dissolving the light absorbing material and the binder in an organic solvent on the light-heat conversion layer.

Figure 15:
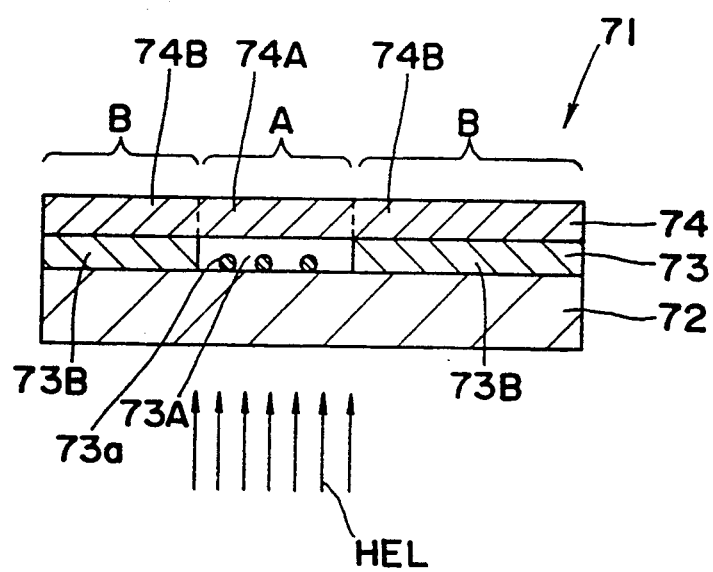
FIG. 15 is a schematic view showing a condition wherein the image forming material of FIG. 14 is imagewise exposed to a high density energy light.

The image forming process (C) of the invention is first conducted by imagewise exposing to light the light-sensitive material 71. FIG. 15 shows a condition wherein the light-sensitive material is imagewise exposed to a high density energy light.

The examples of the high density energy light include a laser beam and a xenon lamp. Exposure of the material is conducted by scanning the material with the laser beam or exposing the material to the xenon lamp through a masking film having an image. The laser beam is capable of imagewise exposing by utilizing digital signals from an image-processing system, so that the use of the laser beam as the high density energy light is preferred. Examples of the laser beams include a gas laser such as an argon laser, a solid laser such as YAG laser (yttrium aluminum garnet laser) and a semi-conductor laser.

In FIG. 15, the light sensitive material 71 (FIG. 14) is imagewise exposed to a high density energy light applied from the side of the support 72. When the support is exposed to the high density energy light, the high density energy light passes through the support 72 and is incident upon the light-heat conversion layer 73, whereby the metal of the light-heat conversion layer 73A in the exposed area is melted. The melted metal is coagulated to form a small mass 73a, and therefore the light-heat conversion layer 73A in the exposed area almost disappears to form a cavity. As a result, the image forming layer 74A in the area corresponding to the exposed area does not bond to the support On the other hand, the light-heat conversion layer 73B unexposed to the high density energy light (unexposed area) does not change, so that the image forming layer 74A in the unexposed area is bonded to the support 72 through the light-heat conversion layer 73.

Figure 16:
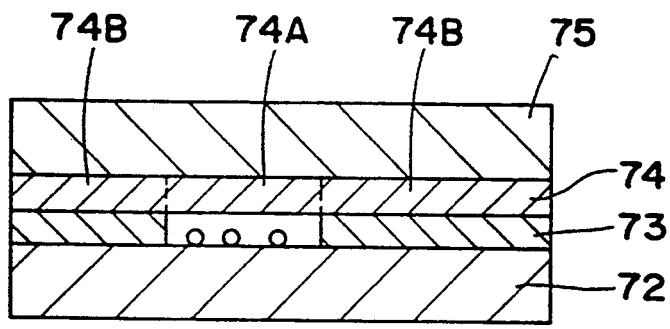
FIG. 16 is a schematic view showing a condition wherein a receiving sheet is laminated on the exposed image forming material of FIG. 15.

Subsequently, as shown in FIG. 16, the receiving sheet 75 having an adhesive layer is placed on the image forming layer 74. The receiving sheet may be previously (before the exposing procedure) provided on the image forming layer in the form of a cover sheet. This structure is used in the image forming process (D) of the invention. Further, an adhesive can be coated on the image forming layer. In the process, it is required that the bonding strength between the receiving sheet 75 and the image forming layer 74 is less than that of the light-heat conversion layer 73 and the support 72 and that of the light-heat conversion layer 73 and the image forming layer 74.

Figure 17:
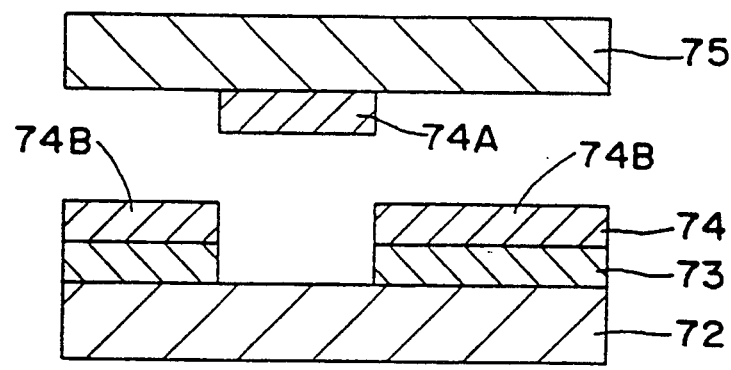
FIG. 17 is a schematic view showing a condition wherein the receiving sheet is removed from the image forming material of FIG. 16.

Then, the receiving sheet 75 is peeled from the support 72, as shown in FIG. 17. The bonding strength between the receiving sheet 75 and the image forming layer 74 is less than that of the light-heat conversion layer 73 and the support 72 and that of the light-heat conversion layer 73 and the image forming layer 74. Therefore, image forming layer 74B in the unexposed area is left on the light-heat conversion layer 73, while the image forming layer 74A in the exposed area is transferred to the receiving sheet 75 due to the disappearance of the light-heat conversion layer 73A in the exposed area.

The receiving sheet 75 should have the following functions: (1) function of removing the image forming layer in the exposed area and leaving the image forming layer in the unexposed area on the light-heat conversion layer; and (2) function as the permanent support carrying the peeled image forming layer (image portion) or (3) function as a temporary support carrying the image portion. It is required that the receiving sheet 75 has a mechanical strength to satisfy the above functions and has an adequate bonding strength to satisfy the (1) above. The receiving sheet 75 may have an adhesive layer thereon to have an adequate bonding strength.

Thus, the receiving sheet 75 generally is made of the materials described in the support 72. Further, a paper sheet and a surface-coated paper sheet can be employed. The adhesive layer of the receiving sheet is generally formed by coating a mixture of an agent imparting adhesive such as rosin or a plasticizer and an organic polymer. Particularly, materials used in pressure-sensitive adhesive tapes are preferred.

The function (3) above of the receiving sheet 75 is, for example, utilized for the preparation of a color proof in the field of printing. In this case, the image formed on the receiving sheet is laminated onto a support (e.g., printing paper) to give a proof to be transferred. Further, the bonding between the receiving sheet and the image forming layer is required to have an adequate releasability to transfer the image to the support for giving a proof. Preferred materials of the receiving sheet having such function are described in Japanese Patent Publications No. 60(1985)-31238 and No. 60(1985)-40847. The image having a hue of cyan, magenta, yellow or black formed on the receiving sheet can be transferred to the printing paper by a laminator.

The thickness of the receiving sheet generally is not less than 5 μm, preferably not less than 25 μm. In the case that the thickness is too small, the receiving sheet is lowered in handling performance and dimensional accuracy. On the other hand, the thickness of the receiving sheet is preferably not more than 200 μm from the viewpoint of handling performance, although the upper limit can not be precisely determined. Since the thickness varies depending upon the desired use, an optimum thickness is adequately determined from the consideration of the use.

In the above manner, to the receiving sheet 75 is transferred the image forming layer corresponding to the exposed area of a high density energy light and to the image forming material 71 is left the image forming layer corresponding to the unexposed area.

The support having the above formed image is useful for the preparation of a lith film or masking film in the field of a printing.

The masking film is generally used in printing, and its image preferably has an optical density of not less than 1.5, and more preferably not less than 2.5. In the case that the image of the masking film is composed only of a metal layer, the thickness of the layer is needed to be large in order to enhance its optical density. On the other hand, in the case that the image of the masking film is composed only of a coloring material layer, the thickness of the layer is needed to be large in order to enhance its optical density.

The image on the support which is formed in the above manner is composed of a combination of the light-heat conversion layer containing a metal and the image forming layer containing a coloring material, so that even these layers having relatively thin thicknesses give optical density required in the masking film and a high resolution. In the image forming process of FIG. 17, difference between the optical density of the image (the image forming layer 74B and the light-heat conversion layer 73 corresponding to the area 74B) on the support 72 and that of an area having no image is generally not less than 1.5, preferably not less than 1.8, more preferably not less than 2.5. Accordingly, it is preferred to select material, thickness and image forming conditions of the image forming layer and the light-heat conversion layer and exposing conditions so as to give the above difference.

In FIG. 15, embodiment wherein the light is applied from the support side is shown, however exposure to a light applied from the image forming layer can be done.

Figure 18:
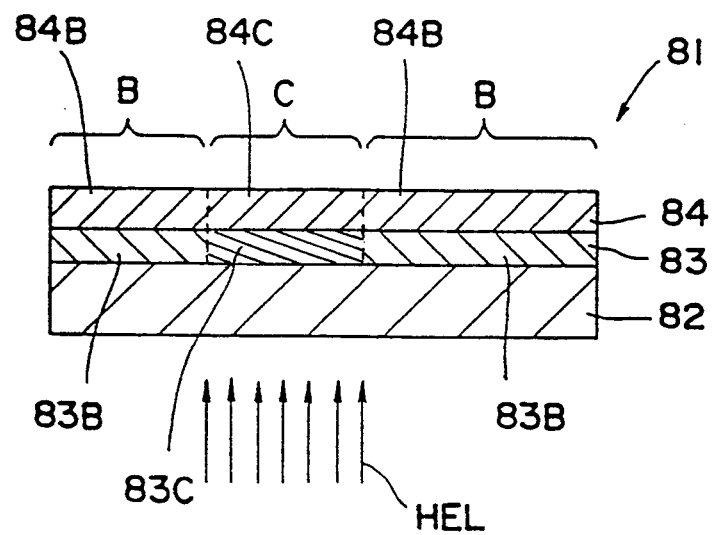
FIG. 18 is a schematic view showing another condition wherein the image forming material of FIG. 14 is imagewise exposed to a high density energy light.

Another embodiment wherein the light-sensitive image forming material is imagewise exposed to light in the image forming process (C) of the invention is shown in FIG. 18.

In FIG. 18, the light-sensitive material 81 is imagewise exposed to a high density energy light applied from the side of the support 82. When the support is exposed to the high density energy light, the high density energy light passes through the support 82 and is incident upon the light-heat conversion layer 83, whereby the metal of the light-heat conversion layer 83C in the exposed area is not perfectly melted but partially melted. Even the partially melted metal in the light-heat conversion layer reduces the bonding strength between the image forming layer 84C in the exposed area and the light-heat conversion layer 83C in the exposed area. Accordingly, when the receiving sheet is peeled from the support 82, the image forming layer 84B in the unexposed area is left on the light-heat conversion layer 83, while the image forming layer 84C in the exposed area is removed by the receiving sheet.

As a result, on the receiving sheet is formed the image forming layer 84C in the exposed area of a high density energy light and on the image forming material 81 is left the image forming layer 84B in the unexposed area. Although the bonding strength between the light-heat conversion layer 83 and the support 82 (in the exposed area) sometimes is reduced by exposure to the light, it is possible to prevent the light-heat conversion layer 83C in the exposed area from transferring to the receiving sheet by designing the light-sensitive image forming material to have relation that the bonding strength between the support and the light-heat conversion layer is larger than that between the light-heat conversion layer and the image forming layer. In this way, even if the light-heat conversion layer is completely removed from the image forming layer, an excellent image can be obtained both on the receiving sheet and on the image forming material.

Figure 19:
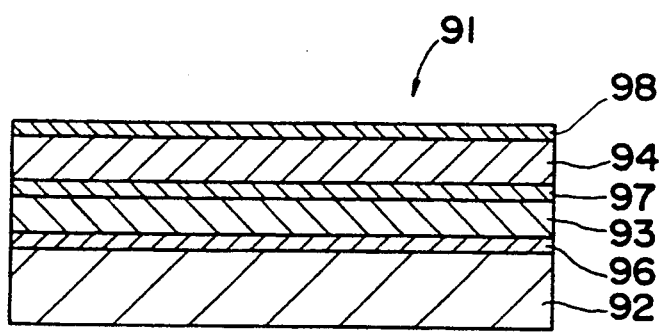
FIG. 19 is a sectional view of another representative example of a light-sensitive image forming material which is advantageously utilized for the image forming process of the invention.

Other representative structure of the light-sensitive image forming material of the invention which is advantageously utilized for the image forming process (C), is shown in FIG. 19.

In FIG. 19, on a support 92 is arranged a subbing layer 96, a light-heat conversion layer 93 is provided thereon, an intermediate layer 97 is formed on the light-heat conversion layer 93, an image forming layer 94 is formed on the light-heat conversion layer 93, and further a protective layer 98 is formed on the image forming layer 94. The support 92 and the five layers 93, 94, 96, 97, 98 constitute the light-sensitive image forming material 91.

The subbing layer 96 can be preferably composed of nitro cellulose, polyester, chlorinated polyethylene, polymethyl methacrylate, polyisobutyl methacrylate, acrylic acid/methacrylic acid copolymer, styrene/maleic acid copolymer, polyvinyl alcohol, poly-N-methylolamide, styrene/vinyltoluene copolymer, chlorosulfonated polyethylene, polyvinyl chloride, vinyl acetate/vinyl chloride copolymer, ethylene/vinyl acetate copolymer or polycarbonate.

The provision of the subbing layer 96 generally increases sensitivity of the light-heat conversion layer to a high density energy light. The thickness of the subbing layer is generally in the range of 0.01 μm to 3 μm, and preferably in the range of 0.03 μm to 0.5 μm. The formation of the subbing layer can be conducted by a known coating method.

The intermediate layer 97 can be preferably composed of a foaming agent (i.e., gas-producing agent) such as a diazo compound or an azido compound, or a polymer such as polyester, nitro cellulose, chlorinated polyethylene or polyisobutyl methacrylate. The provision of the intermediate layer 97 generally increases sensitivity of the light-heat conversion layer to a high density energy light. The thickness of the intermediate layer is generally in the range of 0.02 μm to 2 μm, and preferably in the range of 0.05 μm to 0.5 μm. The formation of the intermediate layer can be conducted by a known coating method.

The protective layer 98 can be preferably composed of polyvinyl butyral, polymethyl methacrylate, polyamide, polyvinyl pyrrolidone, vinyl acetate/vinyl chloride copolymer or ionomer resin. The formation of the subbing layer can be conducted by a known coating method. A film composed of the above polymer can be bonded on the image forming layer. The provision of the protective layer 98 generally prevents damage of the image forming layer in the exposing procedure or renders the transfer of the image forming layer to the receiving sheet easy. The thickness of the protective layer is generally in the range of 0.05 $\mu$m to 3 $\mu$m, and preferably in the range of 0.2 $\mu$m to 1.0 $\mu$m.

The image forming process (D) of the invention is described by referring to FIGS. 15, 16, 17 and 20.

Figure 20:
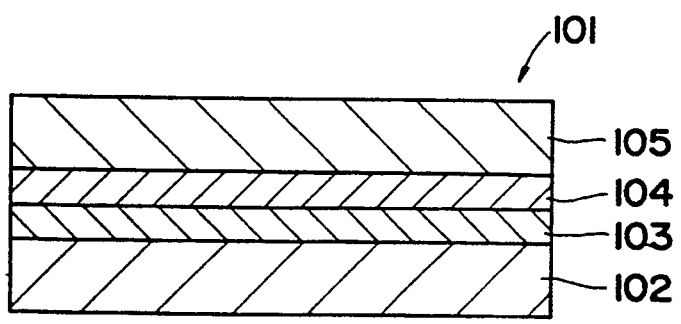
FIG. 20 is a sectional view of a representative example of a light-sensitive image forming material having a cover sheet which is advantageously utilized for the image forming process of the invention.

The representative structure of the light-sensitive image forming material which is advantageously utilized for the image forming process (D), is shown in FIG. 20.

In FIG. 20, on a support 102 is arranged a light-heat conversion layer 103, an image forming layer 104 is formed on the light-heat conversion layer 103, and further a cover sheet (serving as the receiving sheet) 105 is formed. The cover sheet has a adhesive layer thereon. The support 102, the two layers 103, 104 and the sheet 105 constitute the light-sensitive image forming material 101.

The light-sensitive image forming material 101 has a cover sheet 105, which serves as a receiving sheet in FIG. 14. The image forming process (D) is performed in the same manner as the image forming process (C) except for using the cover sheet in place of the receiving sheet.

In more detail, the light-sensitive image forming material 101 is imagewise exposed to a high density energy light applied from the side of the support 102. as shown in FIG. 15, as a result, the bonding strength between the image forming layer 104 and the light-heat conversion layer 103 in the exposed area reduces. When the cover sheet 105 is peeled from the support 102, the image forming layer 104 in the exposed area is fixed on the cover sheet 105 and the image forming layer 104 in the unexposed area is left on the image forming material 101.

The present invention is further described by the following examples.

EXAMPLE 1

A coating solution for forming a light absorbing material layer (light-heat conversion layer) having the following composition was prepared.

Coating Solution for Light Absorbing Material Layer

| Carbon black (Microlithblack C-A available from Ciba-Geigy) | 4.5 weight parts |
| --- | --- |
| Resorcin | 20 weight parts |
| Methoxypropyl acetate | 100 weight parts |
| Methyl ethyl ketone | 200 weight parts |
| Fluorine type surfactant (FC 430 available from Sumitomo 3M Co., Ltd.) | 0.1 weight part |

The above coating solution was coated on a polyethylene terephthalate film having the thickness of 100 $\mu$m using a whirler at rotational speed of 150 rpm, and the coated layer was dried to 120° C. to form a light absorbing material layer having optical density of 0.8 (Macbeth densitometer, white light) whereby a film having the light absorbing material layer was prepared.

To the film is laminated a pressure-sensitive adhesive tape (available from Nitto Electric Industrial Co., Ltd.) at room temperature (23° C.), and then the tape was peeled from the film at a peeling speed of 50 cm/min. The light absorbing material layer containing carbon black did not adhere the tape, i.e., the tape only was peeled from the film. Thus, a bonding strength between the light absorbing material layer and the support was shown to be large.

Subsequently, the following coating solution for forming a thermoplastic resin layer and a coating solution for forming an image forming layer were prepared:

Coating Solution for Thermoplastic Resin Layer

| Polyester resin (Byron 200 available from Toyobo Co., Ltd.) | 1.0 weight part |
| --- | --- |
| Methyl ethyl ketone | 67 weight parts |
| Methoxypropyl acetate | 33 weight parts |
| Fluorine type surfactant (FC 430 available from Sumitomo 3M Co., Ltd.) | 0.1 weight part |

Coating Solution for Image Forming Layer

| Cyan pigment (Microlithblue 4G-A available from Ciba-Geigy) | 4.5 weight parts |
| --- | --- |
| 1-Methoxy-2-propanol | 300 weight parts |
| Fluorine type surfactant (FC 430 available from Sumitomo 3M Co., Ltd.) | 0.1 weight part |

On the light absorbing material layer, the coating solution for a thermoplastic resin layer was coated in the same manner as in the formation of the light absorbing material layer and the coating solution for an image forming layer was further coated on the thermoplastic resin layer in the same manner as above and these layers were dried at 100° C. to form a thermoplastic resin layer having thickness of 0.2 $\mu$m and an image forming layer having thickness of 0.6 $\mu$m to prepare a composite film.

The composite film was exposed through a chrome mask to a light from a high-power xenon flash lamp (V8-2400 available from Tokyo Zenon Co., Ltd. (puls half-width: 3 msec., exposing distance: 10 cm)) with varying its out-put power from 400W to 2400W to prepare a number of exposed samples. A receiving sheet (receiving sheet for color proof T-1 available from Fuji Photo Film Co., Ltd.) was laminated (roll passing temperature: 70° C., feed rate: 900 mm/min.) on the image forming layer of each sample, and then the receiving sheet was peeled from the sample at room temperature.

As a result, at out-put power of 1600W, a cyan image having a distinct contrast was formed on the receiving sheet, whereby the cyan image having a distinct contrast and a resolving power of a line width of 40 $\mu$m was formed on the support (negative image), and the cyan image having a distinct contrast was formed on the receiving sheet (in the form of a positive image).

It is confirmed that the peeling in the unexposed area occurred at the interface between the thermoplastic resin layer and the image forming layer and the peeling in the exposed area occurred at the interface between the image forming layer and the receiving sheet.

EXAMPLES 2-9

The following coating solution for forming an adhesive layer was prepared.

Coating Solution for Adhesive Layer

| | |
|---|---|
| Silane coupling agent (KBM-603 available from Shin-etsu Silicone Co., Ltd.) | 1.0 weight part |
| Methyl ethyl ketone | 100 weight parts |
| Surfactant (Surfron S-131 available from Asahi Glass Co., Ltd.) | 0.1 weight part |

The above coating solution was coated on the light absorbing material layer of the film obtained in the Example 1 and was dried to form an adhesive layer having a thickness of 0.2 μm.

The coating solutions for a thermoplastic resin layer were prepared in the same manner as in the preparation of the thermoplastic resin layer of Example 1 except for replacing the polyester resin with resins set forth in Table 1 below and employing an appropriate solvent for each resin.

TABLE 1

| | Polymer | Trade Name | Out-put Power needed (W) |
|---|---|---|---|
| Example 2 | Ionomer resin | Chemipal S-100 (Mitsui Petrochemical Industries, Ltd.) | 600 |
| Example 3 | Polyvinyl alcohol | Poval PVA-205 (Kuraray Co., Ltd.) | 1,200 |
| Example 4 | Polyvinyl pyrrolidone | PVP K-90 (GAF Co., Ltd.) | 1,200 |
| Example 5 | Polyvinyl butyral | KW-10 (Sekisui Chemical Co., Ltd.) | 900 |
| Example 6 | Styrene/ maleic acid resin | Oxylack SH-101 (Japan Catalytic Chemical Industries Co., Ltd.) | 1,200 |
| Example 7 | Cellulose butyrate acetate | (Ardritch Co., Ltd.) | 900 |
| Example 8 | Water-soluble polyester | Byronal MD-14 | 1,600 |
| Example 9 | Water-soluble polyester | Byronal MD-1200 | 900 |

Each of the resultant coating solutions for thermoplastic resin layer was coated on the adhesive layer using the whirler at rotational speed of 150 rpm, and the coated layer was dried at 100° C. to form a thermoplastic resin layer having thickness of 0.2 μm.

On each of the resultant thermoplastic resin layer, a coating solution for an image forming layer having the following composition was coated using the whirler at rotational speed of 200 rpm, and the coated layer was dried at 100° C. to form the image forming layer having thickness of 0.6 μm.

Coating Solution for Image Forming Layer

| | |
|---|---|
| Carbon black (Microlithblack C-A available from Ciba-Geigy) | 2.0 weight parts |
| n-Propanol | 40 weight parts |
| Methanol | 15 weight parts |
| Methoxypropyl acetate | 5 weight parts |
| Fluorine type surfactant (FC 430 available from Sumitomo 3M Co., Ltd.) | 0.1 weight part |

In this manner, 8 kinds of composite films (Examples 2-9) were prepared.

The composite films were processed and evaluated in the same manner as in Example 1. At the out-put powers (exposing power) shown in Table 1, the cyan image having a distinct contrast, to which the image forming layer in the unexposed area was removed, was formed on the receiving sheet of each film (in the form of a positive image), and the cyan image having a distinct contrast was left on the image forming material (in the form of a negative image).

It was confirmed that the peeling in the unexposed area occurred at the interface between the thermoplastic resin layer and the image forming layer and the peeling in the exposed area occurred at the interface between the image forming layer and the receiving layer.

EXAMPLE 10

The recording characteristics of the composite film obtained in Example 2 was evaluated by a recording method using a semiconductor laser beam as follows:

The laser beam (λ:830 nm, out-put power:30 mW) was focused at a beam diameter of 5 μm on the composite film through a collimator lens and objective lens. On-off of the laser beam was conducted by controlling current of the semiconductor laser produced from signals of a function generator. The composite film was arranged an X-Y stage which is driven by a step-motor, time exposing to puls or laser power was varied by moving the location of the beam by 5 μm each time exposing to form images, whereby the conditions showing an excellent image were determined. Peeling after exposing was conducted in the same manner as in Example 1.

Thus, an excellent image (pattern) having a line width of 8 μm was obtained under the conditions of time exposing to puls of 100 μsec. and laser power of 7 mW.

EXAMPLE 11

The recording characteristics of the composite film obtained in Example 2 was evaluated by a recording method using an argon laser beam as follows:

The laser beam was scanned at a beam diameter of 10 μm at scanning rate of 75 m/sec. on the composite film through a collimator lens and objective lens. Its modulation was conducted by AO modulator provided in the middle of an optical system. Peeling after scanning (exposing) was conducted in the same manner as in Example 2.

Thus, at an exposing power of 400 mW on the film, the image forming layer in the exposed area was left on the thermoplastic resin layer (in the form of a negative image), and the image forming layer in the unexposed area was transferred on the receiving sheet (in the form of a positive image).

EXAMPLE 12

The following coating solution for forming a subbing layer was prepared.

Coating Solution for Subbing Layer

| Silane coupling agent (KBM-603 available from Shin-etsu Silicone Co., Ltd.) | 1.0 weight part |
|---|---|
| n-Propanol | 40 weight parts |
| Methanol | 60 weight parts |
| Surfactant (Surfron S-131 available from Asahi Glass Co., Ltd.) | 1.0 weight part |

The above coating solution was coated on a polyethylene terephthalate film having thickness of 100 μm using a whirler at rotational speed of 250 rpm to form a subbing layer.

The following coating solution for forming a light-heat conversion layer was prepared.

Coating Solution for Light-heat Conversion Layer

| Polyester resin (Byron 200 available from Toyobo Co., Ltd.) | 1.0 weight part |
|---|---|
| Methyl ethyl ketone | 67 weight parts |
| Methoxypropyl acetate | 33 weight parts |
| Fluorine type surfactant (FC 430 available from Sumitomo 3M Co., Ltd.) | 0.1 weight part |
| Carbon black (Microlithblack C-A available from Ciba-Geigy) | 2.0 weight parts |
| Behenic acid | 0.01 weight part |

The above coating solution was coated on the subbing layer using a whirler at revolution rate (rotational speed) of 150 rpm, and the coated layer was dried at 120° C. to form a light-heat conversion layer having optical density of 0.8.

Subsequently, the following coating solution for forming an image forming layer was prepared:

Coating Solution for Image Forming Layer

| Carbon black (Microlithblack C-A available from Ciba-Geigy) | 2.0 weight parts |
|---|---|
| n-Propanol | 40 weight parts |
| Methanol | 15 weight parts |
| Methoxypropyl acetate | 5 weight parts |
| Fluorine type surfactant (FC 430 available from Sumitomo 3M Co., Ltd.) | 0.1 weight part |

On the light-heat conversion layer, the above coating solution was coated in the same manner as in the formation of the light-heat conversion layer to form the image forming layer having thickness of 0.3 μm, whereby a composite film was prepared.

The composite film was processed and evaluated in the same manner as in Example 1. As a result, the image forming layer in the exposed area was left on the light-heat conversion layer (in the form of a negative image), and the image forming layer in an unexposed area was transferred on the receiving sheet (in the form of a positive image).

EXAMPLE 13

A light absorbing material layer was formed on a polyethylene terephthalate film in the same manner as in Example 1 except using novolac type phenol formaldehyde resin (available from Sumitomo Duress Co., Ltd.) instead of resorcin.

Subsequently, the following coating solution for forming a thermoplastic resin layer was prepared:

Coating Solution for Thermoplastic Resin Layer

| Ionomer resin (Chemipal S-100 available from Mitsui Petrochemical Industries, Ltd.) | 37 weight parts |
|---|---|
| Water | 318 weight parts |
| Surfactant (Surfron S-131 available from Asahi Glass Co., Ltd.) | 3.0 weight parts |

The resultant coating solution for a thermoplastic resin layer was coated on the light absorbing material layer using the whirler at rotational speed of 150 rpm, and the coated layer was dried to form the thermoplastic resin layer having thickness of 0.3 μm.

On the resultant thermoplastic resin layer, the following coating solution for an image forming layer was coated using the whirler at rotational speed of 200 rpm, and the coated layer was dried at 100° C. to form the image forming layer having thickness of 0.6 μm.

Coating Solution for Image Forming Layer

| Carbon black (Microlithblack C-A available from Ciba-Geigy) | 2.0 weight parts |
|---|---|
| n-Propanol | 40 weight parts |
| Methanol | 15 weight parts |
| Methoxypropyl acetate | 5 weight parts |
| Fluorine type surfactant (FC 430 available from Sumitomo 3M Co., Ltd.) | 0.1 weight part |

In this manner, a composite film was prepared.

The composite film was processed and evaluated in the same manner as in Example 1. At out-put power of 1200W, the image forming layer in the exposed area was left on the thermoplastic resin layer (in the form of a negative image), and the image forming layer in the unexposed area was transferred on the receiving sheet (in the form of a positive image).

EXAMPLE 14

The following coating solution for forming a thermoplastic resin layer was prepared:

Coating Solution for Thermoplastic Resin Layer

| Ionomer resin | 37 weight parts |

| | |
|---|---|
| (Chemipal S-100 available from Mitsui Petrochemical Industries, Ltd.) | |
| Water | 320 weight parts |
| Surfactant | 3.0 weight parts |
| (Surfron S-131 available from Asahi Glass Co., Ltd.) | |

The resultant coating solution for a thermoplastic resin layer was coated on the adhesive layer obtained in Example 2 using the whirler at rotational speed of 250 rpm, and the coated layer was dried at 100° C. for 2 min. to form a thermoplastic resin layer having thickness of 0.2 μm.

Coating Solution for Image Forming Layer

| | |
|---|---|
| Blue pigment (Microlithblue available from Ciba-Geigy) | 15 weight parts |
| Cellulose acetate butyrate (available from Ardritch Corp.) | 27 weight parts |
| Methyl ethyl ketone | 70 weight parts |

To the above coating solution for forming a image forming layer is added glass beads of 70 weights part and the mixture was dispersed using a paint shaker for 1 hour to prepare a dispersion. Three weights part of the dispersion and 70 weight parts of methyl ethyl ketone were mixed to prepare a final coating solution for forming a image forming layer. The ratio of the pigment and binder (containing binder in blue pigment) was 0.64 (pigment/binder).

The composite film was processed and evaluated in the same manner as Example 2. When an out-put power of the Xenon was 2400W, the same image as one of Example 2 was obtained.

EXAMPLE 15

A composite film was prepared in the same manner as in Example 14 except for forming an image forming layer using cyanine green (available from Dainichiseika Color & Chemicals Mfg. Co., Ltd.) instead of the blue pigment.

The composite film was processed and evaluated in the same manner as in Example 2. When an out-put power of the xenon lamp was 2400W, the same image as one of Example 2 was obtained.

COMPARISON EXAMPLE 1

A composite film was prepared in the same manner as in Example 2 except for forming a light absorbing material layer of the following composition and process.

Coating Solution for Light Absorbing Material Layer

| | |
|---|---|
| Carbon black (Microlithblack C-A available from Ciba-Geigy) | 4.5 weight parts |
| Methoxypropyl acetate | 100 weight parts |
| Methyl ethyl ketone | 200 weight parts |
| Fluorine type surfactant (FC 430 available from Sumitomo 3M Co., Ltd.) | 0.1 weight part |

The above coating solution was coated on a polyethylene terephthalate film having thickness of 100 μm using a whirler at revolution rate (rotational speed) of 150 rpm, and the coated layer was dried at 120° C. to form a light absorbing material layer having optical density of 0.8 (Macbeth densitometer, white light) whereby a film having the light absorbing material layer was prepared.

To the film is laminated a pressure-sensitive adhesive tape (available from Nitto Electric Industrial Co., Ltd.) at room temperature (23° C.), and then the tape was peeled from the film at a peeling speed of 50 cm/min. The above light absorbing material layer containing no resorcin easily adhered to the tape to peel from the support.

The composite film was processed and evaluated in the same manner as in Example 2. As a result, the light absorbing material layer in the unexposed area was also transferred on the receiving sheet with the image forming layer, so that an excellent image (in the form of a positive image) was not obtained on the receiving sheet.

COMPARISON EXAMPLE 2

A composite film was prepared in the same manner as in Example 2 except for forming no adhesive layer comprising silane coupling agent.

The composite film was processed and evaluated in the same manner as in Example 2. As a result, the image forming layer in the unexposed area was not only transferred on the receiving sheet, but the light absorbing material layer in the unexposed area was also partially transferred on the receiving sheet, so that an excellent image (in the form of a positive image) was not obtained.

EXAMPLE 16

The following coating solution for forming a chlorinated polyethylene layer was prepared:

Coating Solution for Chlorinated Polyethylene Layer

| | |
|---|---|
| Chlorinated polyethylene | 0.5 weight part |
| Methyl ethyl ketone | 99.5 weight parts |

The above coating solution was coated on a polyethylene terephthalate film having thickness of 100 μm using a whirler, and the coated layer was dried at 100° C. for 2 min. to form a chlorinated polyethylene layer having thickness of 0.05 μm. On the chlorinated polyethylene layer, GeS and In were co-deposited to form a light-heat conversion layer (GeS/In layer) having thickness of 60 nm.

Subsequently, the following coating solution for forming an image forming layer was prepared:

Coating Solution for Image Forming Layer

| | |
|---|---|
| (Mother liquor) | |
| Benzilmethacrylate/methacrylic acid copolymer | 20 weight parts |
| Methyl ethyl ketone | 80 weight parts |
| (Coating solution) | |
| Mother liquor (described above) | 110 weight parts |
| Methyl ethyl ketone | 40 weight parts |
| Methyl cellosolve acetate | 25 weight parts |
| Cyanine blue (Cyanine blue-4920 available from Dainichiseika Color & Chemicals Mfg. Co., Ltd.) | 12.2 weight parts |
| Fluorine type surfactant (FC 430 available from Sumitomo 3M Co., Ltd.) | 2.0 weight parts |

The above coating solution was coated on the light-heat conversion layer using a whirler to form a coated layer having 0.5 μm, and the coated layer was dried at 100° C. for 2 min. to form an image forming layer having optical density of 1.0 (Macbeth densitometer, white light).

In this manner, a composite film comprising the support, the chlorinated polyethylene layer, a light-heat conversion layer and the image forming layer was prepared.

The laser beam (beam diameter:10 μm, output power:300 mW) generated from an argon laser was scanned on the composite film at scanning rate of 38 m/sec. A receiving sheet (Color art receiving sheet CR-T3 available from Fuji Photo Film Co., Ltd.) was laminated on the above composite sheet using a roller (4.5 kG/m²) heated at 80° C. at feed rate of 900 m/min., and the receiving sheet was peeled from the composite sheet at room temperature. Thus, the image corresponding to the exposed area was transferred onto the receiving sheet (in the form of a negative image), and the image corresponding to the unexposed area was left on the light-heat conversion layer (in the form of a positive image).

Then, the spectrum of positive image formed on the image forming material was measured. As a result, it was confirmed that the image had optical density of not less than 2.5 in a region of short wavelengths in the vicinity of 365 nm, so that it was shown that the support having the image has a sufficiently high optical density to use in a lith film.

A cyan sensitive material (Color art CN-1 available from Fuji Photo Film Co., Ltd.) was exposed through the above support having the image using a printer (P-617-G available from Dainippon Screen Co., Ltd.) by contact exposing of 80 counts. Then, the material was developed in a processor for color art. The image of developed material showed dot in the range of 2% to 98%. Accordingly, it was shown that the support having the image can be used as a masking film.

EXAMPLE 17

A composite film was prepared in the same manner as in Example 16 except for forming an image forming layer using Seika fast carmine 1483 (available from Dainichiseika Color & Chemicals Mfg. Co., Ltd.) of 12.2 weight parts instead of the cyanine blue-4920.

The composite film was evaluated by exposing and peeling in the same manner as in Example 16. The support having the image has a sufficiently high optical density for use as a lith film. It was shown that the support having the image can be used as a lith film and masking film.

EXAMPLE 18

A composite film was prepared in the same manner as in Example 16 except for forming an light-heat conversion layer using SnS and Sn instead of GeS and In. The recording characteristics of the composite film was evaluated by a recording method using an argon laser beam as follows:

The laser beam (beam diameter:10 μm, output power:300 mW) generated by an argon laser was scanned at scanning rate of 38 m/sec. A receiving sheet (Color art receiving sheet CR-T3 available from Fuji Photo Film Co., Ltd.) was laminated (4.5 kg/m²) on the above composite sheet using a roller heated to 80° C. at feed rate of 900 m/min., and the receiving sheet was peeled from the composite sheet at room temperature. Thus, the image corresponding to the exposed area was transferred on the receiving sheet (in the form, of a negative image).

Then, the image formed on the receiving sheet was transferred to a printing paper. The image was an excellent image which showed a resolving power of 10 μm.

EXAMPLE 19

A composite film was prepared in the same manner as in Example 18 except for forming an image forming layer using Seika fast carmine 1483 (available from Dainichiseika Color & Chemicals Mfg. Co., Ltd.) of 12.2 weight parts instead of Cyanine blue-4920.

The image corresponding to the exposed area of the composite film was transferred onto the receiving sheet (in the form of a negative image) in the same manner as in Example 18. The image formed on the receiving sheet was transferred to a printing paper. The transferred image had excellent quality.

EXAMPLE 20

A composite film A was prepared in the same manner as in Example 18 except for forming a protective layer on the image forming layer.

The following coating solution was coated in the same manner as in the formation of the image forming layer of Example 18 on the image forming layer to form a protective layer having thickness of 0.5 μm.

Coating Solution for Protective Layer

| | |
|---|---|
| Ionomer resin (Chemipal S-100 available from Mitsui Petrochemical Industries, Ltd.) | 37 weight parts |
| Water | 318 weight parts |
| Surfactant (Surfron S-121 available from Asahi Glass Co., Ltd.) | 30 weight parts |

In this manner, the composite film A was prepared. The image corresponding to the exposed area of the composite film A was transferred onto the receiving sheet (in the form of a negative image) in the same manner as in Example 18. The image formed on the receiving sheet was transferred to a printing paper. The obtained image was an excellent blue image.

Separately, a composite film B was prepared in the same manner as in Example 19 except for forming the above protective layer on the image forming layer. The image corresponding to the exposed area of the composite film B was transferred onto the receiving sheet (in the form of a negative image) in the same manner as in the preparation of the composite film A. A mazenta image formed on the receiving sheet was transferred to a printing paper in which the blue image of composite film A was transferred, whereby an image having two colors in which the blue image and the mazenta image were overlaid via the protective layer was formed.

We claim:
1. An image forming process comprising the steps of:
    imagewise exposing to light a light-sensitive image forming material comprising a support, a light-heat conversion layer provided thereon and an image forming layer provided on the light-heat conversion layer, to increase a bonding strength between the light-heat conversion layer and the image forming layer in the exposed area, pressing a receiving sheet onto the image forming layer, and removing the receiving sheet from the image forming material together with the image forming layer in the unexposed area so as to form a positive image on the receiving sheet and to leave a negative image on the light-heat conversion layer which corresponds to the image forming layer in the exposed area.

2. The image forming process as claimed in claim 1, wherein the light-heat conversion layer comprises a light-absorbing material and a thermoplastic resin.

3. The image forming process as claimed in claim 1, wherein the light-heat conversion layer comprises a combination of a light-absorbing material layer and a thermoplastic resin layer provided thereon.

4. An image forming process comprising the steps of:
imagewise exposing to light a light-sensitive image forming material comprising a support, a light-heat conversion layer provided thereon, an image forming layer provided on the light-heat conversion layer and a cover sheet provided on the image forming layer, to increase a bonding strength between the light-heat conversion layer and the image forming layer in the exposed area, and removing the cover sheet from the image forming material together with the image forming layer in the unexposed area so as to form a positive image on the cover sheet and to leave a negative image on the light-heat conversion layer which corresponds to the image forming layer in the exposed area.

5. The image forming process as claimed in claim 4, wherein the light-heat conversion layer comprises a light-absorbing material and a thermoplastic resin.

6. The image forming process as claimed in claim 4, wherein the light-heat conversion layer comprises a combination of a light-absorbing material layer and a thermoplastic resin layer provided thereon.

7. An image forming process comprising the steps of:
imagewise exposing to light a light-sensitive image forming material comprising a support, a light-heat conversion layer provided thereon and an image forming layer provided on the light-heat conversion layer, to decrease a bonding strength between the light-heat conversion layer and the image forming layer in the exposed area, pressing a receiving sheet onto the image forming layer, and removing the receiving sheet from the image forming material together with the image forming layer in the exposed area so as to form a negative image on the receiving sheet and to leave a positive image on the light-heat conversion layer which corresponds to the image forming layer in the unexposed area.

8. The image forming process as claimed in claim 7, wherein the light-heat conversion layer comprises a metal or a metal alloy.

9. An image forming process comprising the steps,
imagewise exposing to a laser beam from a semiconductor laser, a light-sensitive image forming material comprising a support, a light-heat conversion layer provided thereon, an intermediate layer comprising a polymer which produces a gas upon heating provided on the light-heat conversion layer, an image forming layer provided on the intermediate layer, and a cover sheet provided on the image forming layer, to decrease a bonding strength between the light-heat conversion layer and the image forming layer in the exposed area, and removing the cover sheet from the image forming material together with the image forming layer in the exposed area so as to form a negative image on the cover sheet and to leave a positive image on the light-heat conversion layer which corresponds to the image forming layer in the unexposed area.

10. The image forming process as claimed in claim 9, wherein the light-heat conversion layer comprises metal, metal alloy or carbon black.

11. A light-sensitive image forming material which comprises a support, a light-heat conversion layer provided thereon comprising a light-absorbing material and a thermoplastic resin, an intermediate layer comprising a polymer which produces a gas upon heating provided on the light-heat conversion layer, and an image forming layer comprising a coloring material provided on the intermediate layer, and has a property that a bonding strength between the light-heat conversion layer and the image forming layer is increased by being exposed to light.

12. The light-sensitive image forming material as claimed in claim 11, wherein the image forming layer has a cover sheet thereon.

13. The image forming process as claimed in claim 9, wherein the intermediate layer comprises nitrocellulose or chlorinated polyethylene.

14. The image forming process as claimed in claim 9, wherein the intermediate layer has a thickness of 0.02 $\mu$m to 2 $\mu$m.

15. The light-sensitive image forming material as claimed in claim 11, wherein the intermediate layer has a thickness of 0.02 to 2 $\mu$m.

* * * * *